US011874305B2

(12) United States Patent
Fan

(10) Patent No.: US 11,874,305 B2
(45) Date of Patent: Jan. 16, 2024

(54) ATTENUATOR AND DIFFERENTIAL VOLTAGE PROBE

(71) Applicant: SHENZHEN ZHIYONG ELECTRONICS CO., LTD., Guangdong (CN)

(72) Inventor: Xiaoming Fan, Guangdong (CN)

(73) Assignee: SHENZHEN ZHIYONG ELECTRONICS CO., LTD., Shenzhen (CN)

( * ) Notice: Subject to any disclaimer, the term of this patent is extended or adjusted under 35 U.S.C. 154(b) by 200 days.

(21) Appl. No.: 17/640,826

(22) PCT Filed: Jul. 27, 2021

(86) PCT No.: PCT/CN2021/108542
§ 371 (c)(1),
(2) Date: Mar. 6, 2022

(87) PCT Pub. No.: WO2022/042172
PCT Pub. Date: Mar. 3, 2022

(65) Prior Publication Data
US 2022/0341974 A1  Oct. 27, 2022

(30) Foreign Application Priority Data
Aug. 25, 2020 (CN) .......................... 202010868930.4

(51) Int. Cl.
G01R 19/10 (2006.01)
H03H 7/24 (2006.01)
(52) U.S. Cl.
CPC .............. G01R 19/10 (2013.01); H03H 7/24 (2013.01)
(58) Field of Classification Search
CPC .. G01R 19/00; G01R 19/10; G01R 19/16557; G01R 1/30; G01R 27/28; G01R 19/0084;
(Continued)

(56) References Cited

U.S. PATENT DOCUMENTS

2004/0140819 A1  7/2004  McTigue et al.
2006/0176030 A1*  8/2006  Van Epps .......... G01R 1/06772
323/234

(Continued)

FOREIGN PATENT DOCUMENTS

CN  101750522 A  6/2010
CN  107947191 A  4/2018

OTHER PUBLICATIONS

International Search Report of PCT Patent Application No. PCT/CN2021/108542 dated Nov. 1, 2021.

Primary Examiner — Son T Le

(57) ABSTRACT

The application provides an attenuator and a differential voltage probe, comprising a forward attenuation circuit and a reverse attenuation circuit which are symmetrical with each other, a first compensation unit and a third compensation unit which are symmetrical with each other, a second compensation unit and a fourth compensation unit which are symmetrical with each other, and a differential amplifier; the four compensation units are all adjustable capacitor units composed of constant capacitance; a positive-going signal to be tested is attenuated by the forward attenuation circuit, and frequency characteristics of a preset frequency point are adjusted by the first compensation unit and second compensation unit; a negative-going signal to be tested is attenuated by the reverse attenuation circuit, and frequency characteristics of a preset frequency point are adjusted by the third compensation unit and fourth compensation unit; finally, the difference value is calculated by the differential amplifier, amplified and output.

20 Claims, 4 Drawing Sheets

(58) Field of Classification Search
CPC .......... G01R 15/00; G01R 1/06; G01R 1/067; G01R 31/31706; G01R 1/06772; G01R 1/06766; H03H 7/24; H03H 7/25; H03H 2210/025; H03H 2210/036

See application file for complete search history.

(56) References Cited

U.S. PATENT DOCUMENTS

2006/0284681 A1* 12/2006 Pollock .................... H03H 7/24
                                                           330/284
2018/0328961 A1    11/2018 Mende et al.

* cited by examiner

ATTENUATOR AND DIFFERENTIAL VOLTAGE PROBE

The present application claims the benefit of Chinese patent application No. 202010868930.4, titled "Attenuator and differential voltage probe", and filed on Aug. 25, 2020, the contents of which are incorporated herein by reference in their entirety.

TECHNICAL FIELD

The application relates to the technical field of electronics, in particular to an attenuator and a differential voltage probe.

BACKGROUND

Differential voltage probe is a probe device for measuring high voltage floating ground voltage, which is widely used in the field of power electronics.

Hundreds of volts of high voltage to be measured are input from the anode and cathode of the differential voltage probe, and output after passing through the attenuator in the differential voltage probe. In order to meet the requirement that the frequency range of the signal to be tested is DC to 200M, the existing differential voltage probes are equipped with mutually symmetrical attenuators in the positive-going signal attenuation branch and the negative-going signal attenuation branch respectively, and the amplitude-frequency characteristics of the attenuators are kept flat and symmetrical in a wide frequency range. The symmetrical attenuators adjust the frequency characteristics of different frequency bands by setting adjustable capacitors. The inventor realized that the capacity of the existing adjustable capacitor is easily affected by temperature, humidity and mechanical vibration, and its stability is not good. After long-term use, the frequency characteristics of the attenuator would change, which would further distort the output signal of the differential voltage probe and reduce the measurement accuracy of the differential voltage probe.

SUMMARY

The application provides an attenuator and a differential voltage probe, aiming at solving the problems of poor stability of the attenuator and distortion of the measurement results of the differential voltage probe when adjustable capacitors are used to adjust amplitude-frequency characteristics in the prior art.

The application is realized as follows: an attenuator is provided, comprising a forward attenuation circuit and a reverse attenuation circuit which are symmetrical with each other, a first compensation unit and a third compensation unit which are symmetrical with each other, a second compensation unit and a fourth compensation unit which are symmetrical with each other, and a differential amplifier;
  a first end of the forward attenuation circuit is connected with a positive polarity of a signal to be tested, and a second end is connected with a non-inverting input of the differential amplifier, a third end is connected with a first end of the first compensation unit, and a fourth end is connected with a first end of the second compensation unit;
  a first end of the reverse attenuation circuit is connected with a negative polarity of a signal to be tested, and a second end is connected with an inverting input of the differential amplifier, a third end is connected with a first end of the third compensation unit, and a fourth end is connected with a first end of the fourth compensation unit;
  a fifth end of the forward attenuation circuit and a fifth end of the reverse attenuation circuit are commonly connected to a floating output;
  second ends of the first compensation unit, the second compensation unit, the third compensation unit and the fourth compensation unit are respectively connected to a floating output;
  the forward attenuation circuit is used to attenuate a positive-going signal to be tested, and adjust the frequency characteristics of a preset frequency point through the first compensation unit and the second compensation unit;
  the reverse attenuation circuit is used to attenuate a negative-going signal to be tested, and adjust the frequency characteristics of a preset frequency point through the third compensation unit and the fourth compensation unit;
  the differential amplifier is used for receiving the positive-going signal to be tested attenuated by the forward attenuation circuit and the negative-going signal to be tested attenuated by the reverse attenuation circuit, and amplifying and outputting a difference between the attenuated positive-going signal to be tested and negative-going signal to be tested according to a preset gain.

Optionally, the forward attenuation circuit includes a first resistor, a second resistor, a third resistor and a first capacitor;
  a first parallel end of the first capacitor and the first resistor is connected with a positive polarity of a signal to be tested, and a second parallel end of the first capacitor and the first resistor is connected with a first end of the first compensation unit and a first end of the second resistor;
  a common between a second end of the second resistor and a first end of the third resistor is connected with a first end of the second compensation unit and a non-inverting input of the differential amplifier;
  a second end of the third resistor is connected with a floating output.

Optionally, the reverse attenuation circuit includes a fourth resistor, a fifth resistor, a sixth resistor and a second capacitor.
  a first parallel end of the second capacitor and the fourth resistor is connected with a negative polarity of a signal to be tested, and a second parallel end of the second capacitor and the fourth resistor is connected with a first end of the third compensation unit and a first end of the fifth resistor;
  a common between a second end of the fifth resistor and a first end of the sixth resistor is connected with a first end of the fourth compensation unit and an inverting input of the differential amplifier;
  a second end of the sixth resistor is connected with a floating output.

Optionally, the first compensation unit/third compensation unit includes:
  a first compensation resistor;
  at least K fixed-value capacitor units connected in parallel, a first parallel end of the fixed-value capacitor units is connected with the first compensation resistor, and a second parallel end is connected with a floating output, and each fixed-value capacitor unit comprises a switch and a fixed-value capacitor connected in series with each other;

a capacity of each fixed-value capacitor corresponds to a bit value of a binary bit;

and K is a positive integer.

Optionally, the second compensation unit/fourth compensation unit includes:

a second compensation resistor;

at least K fixed-value capacitor units connected in parallel, a first parallel end of the fixed-value capacitor units is connected with the first compensation resistor, and a second parallel end is connected with a floating output, and each fixed-value capacitor unit comprises a switch and a fixed-value capacitor connected in series with each other;

a capacity of each fixed-value capacitor corresponds to a bit value of a binary bit;

and K is a positive integer.

Optionally, a fixed-value capacity of each fixed-value capacitor unit is: $P*2^{(k-1)}$;

in which P represents the lowest capacity, P represents the binary bit corresponding to the fixed-value capacitor unit, k=1, 2, ..., K.

Optionally, the switch is a mechanical switch in a binary encoder;

the attenuator also comprises at least one binary encoder.

Optionally, the binary encoder is an 8421 rotary encoder.

Optionally, the switch is an electric control switch;

the attenuator also comprises a controller;

a control end of the electric control switch is connected with the controller;

the controller is configured to output a binary signal to control the on-off of the electric control switch.

Optionally, the fixed-value capacitor is a ceramic capacitor.

The application also provides a differential voltage probe, which comprises the above-described attenuator. The application provides an attenuator, comprising a forward attenuation circuit and a reverse attenuation circuit which are symmetrical with each other, a first compensation unit and a third compensation unit which are symmetrical with each other, a second compensation unit and a fourth compensation unit which are symmetrical with each other, and a differential amplifier; the first compensation unit, second compensation unit, third compensation unit and fourth compensation unit are all adjustable capacitor units composed of constant capacitance; a positive-going signal to be tested is attenuated by the forward attenuation circuit, and frequency characteristics of a preset frequency point are adjusted by the first compensation unit and second compensation unit; a negative-going signal to be tested is attenuated by the reverse attenuation circuit, and frequency characteristics of a preset frequency point are adjusted by the third compensation unit and fourth compensation unit; finally, the differential amplifier is used to calculate the difference value, amplify it and output it. According to the embodiments of the present application, the existing adjustable capacitors are replaced by the compensation unit composed of fixed-value capacitors, which not only realizes the adjustment range of the adjustable capacitance, but also overcomes the disadvantage that the adjustable capacitance is easily influenced by the environment, effectively solving the problems of poor stability of the attenuator and distortion of the measurement results of the differential voltage probe when the adjustable capacitors are used to adjust the amplitude-frequency characteristics in the prior art.

Details of one or more embodiments of this application are set forth in the following drawings and descriptions, and other features and advantages of this application will become apparent from the description, drawings and claims.

BRIEF DESCRIPTION OF DRAWINGS

In order to more clearly illustrate the technical solution of the embodiments of the present application, the drawings in the description of the embodiments or the prior art is briefly introduced as follows. Obviously, the drawings in the following description are only some embodiments of the present application, and for those skilled in the art, other drawings may be obtained according to these drawings without any creative effort.

DETAILED DESCRIPTION OF DISCLOSED EMBODIMENTS

In order to make the purpose, technical solution and advantages of the present application clearer, the present application will be further described in detail below with reference to the drawings and embodiments.

It should be understood that the specific embodiments described here are only used to illustrate the application, not to limit the application. The application provides an attenuator, comprising a forward attenuation circuit and a reverse attenuation circuit which are symmetrical with each other, a first compensation unit and a third compensation unit which are symmetrical with each other, a second compensation unit and a fourth compensation unit which are symmetrical with each other, and a differential amplifier; the first compensation unit, second compensation unit, third compensation unit and fourth compensation unit are all adjustable capacitor units composed of constant capacitance; a positive-going signal to be tested is attenuated by the forward attenuation circuit, and frequency characteristics of a preset frequency point are adjusted by the first compensation unit and second compensation unit; a negative-going signal to be tested is attenuated by the reverse attenuation circuit, and frequency characteristics of a preset frequency point are adjusted by the third compensation unit and fourth compensation unit; finally, the differential amplifier is used to calculate the difference value, amplify it and output it. According to the embodiments of the present application, the existing adjustable capacitors are replaced by the compensation unit composed of fixed-value capacitors, which not only realizes the adjustment range of the adjustable capacitance, but also overcomes the disadvantage that the adjustable capacitance is easily influenced by the environment, effectively solving the problems of poor stability of the attenuator and distortion of the measurement results of the differential voltage probe when the adjustable capacitors are used to adjust the amplitude-frequency characteristics in the prior art.

Figure 1:
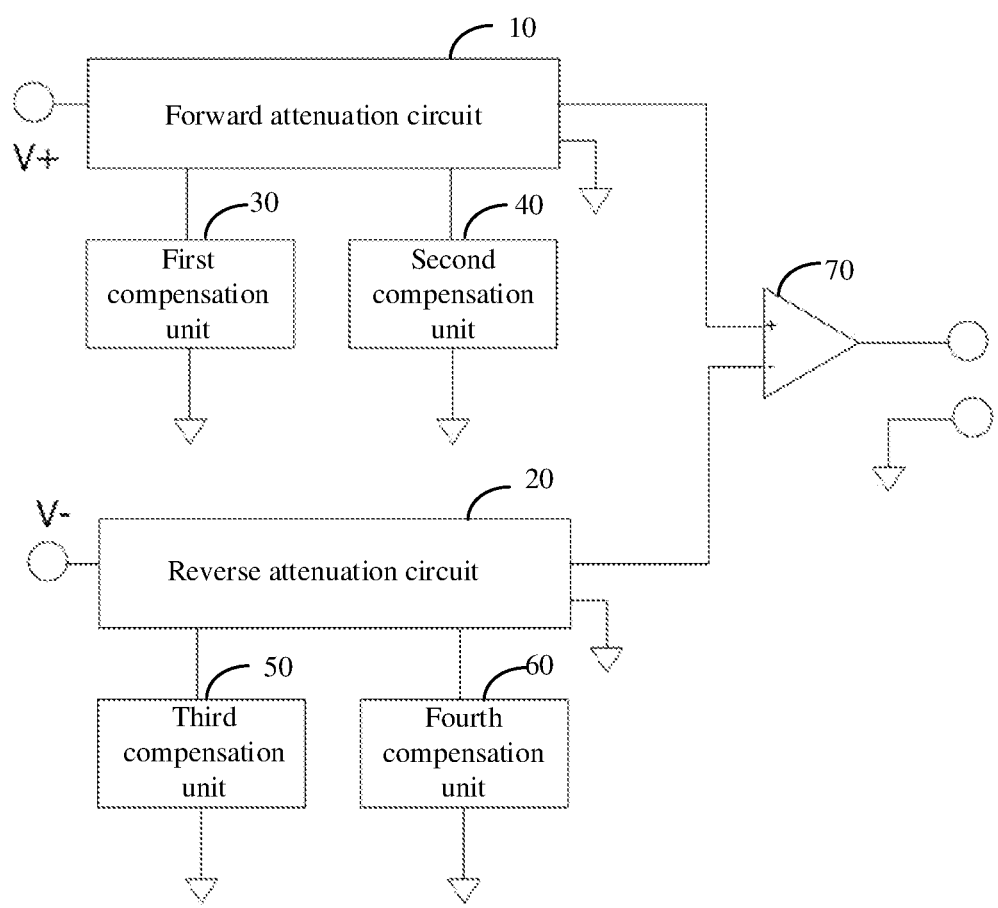
FIG. 1 is a schematic diagram of the circuit structure of an attenuator provided by an embodiment of this application.

FIG. 1 is a schematic diagram of the circuit structure of an attenuator provided by another embodiment of this application. As shown in FIG. 1, the attenuator includes a forward attenuation circuit 10 and a reverse attenuation circuit 160 which are symmetrical with each other, a first compensation unit 30 and a third compensation unit 50 which are symmetrical with each other, a second compensation unit 40 and a fourth compensation unit 60 which are symmetrical with each other, and a differential amplifier 70;

a first end of the forward attenuation circuit 10 is connected with a positive polarity of a signal to be tested, and a second end is connected with a non-inverting input of the differential amplifier 70, a third end is connected with a first end of the first compensation unit 30, and a fourth end is connected with a first end of the second compensation unit 40;

a first end of the reverse attenuation circuit 20 is connected with a negative polarity of a signal to be tested, and a second end is connected with an inverting input of the differential amplifier 70, a third end is connected with a first end of the third compensation unit 50, and a fourth end is connected with a first end of the fourth compensation unit 60;

a fifth end of the forward attenuation circuit 10 and a fifth end of the reverse attenuation circuit 20 are commonly connected to a floating output;

second ends of the first compensation unit 30, the second compensation unit 40, the third compensation unit 50 and the fourth compensation unit 60 are respectively connected to a floating output;

the forward attenuation circuit 10 is used to attenuate a positive-going signal to be tested, and adjust the frequency characteristics of a preset frequency point through the first compensation unit 30 and the second compensation unit 40;

the reverse attenuation circuit 20 is used to attenuate a negative-going signal to be tested, and adjust the frequency characteristics of a preset frequency point through the third compensation unit 50 and the fourth compensation unit 60;

the differential amplifier 70 is used for receiving the positive-going signal to be tested attenuated by the forward attenuation circuit 10 and the negative-going signal to be tested attenuated by the reverse attenuation circuit 20, and amplifying and outputting a difference between the attenuated positive-going signal to be tested and negative-going signal to be tested according to a preset gain.

In this embodiment, the forward attenuation circuit 10 and the reverse attenuation circuit 20 are two symmetrical signal attenuation branches with the same structure. The forward attenuation circuit 10 receives the positive-going signal to be tested from the positive polarity V+ of the signal to be tested, attenuates the positive-going signal to be tested, and then sends it to the non-inverting input of the differential amplifier 70. The reverse attenuation circuit 20 receives the negative-going signal to be tested from the negative polarity V− of the signal to be tested, attenuates the negative-going signal to be tested, and then sends it to the inverting input of the differential amplifier 70. An output end of the differential amplifier 70 is connected to a floating output, the attenuated positive-going signal to be tested is received from the forward attenuation circuit 10, and the attenuated negative-going signal to be tested is received from the reverse attenuation circuit 20, the difference between them is calculated, amplified according to a preset gain, and then output.

Furthermore, in this embodiment, the forward attenuation circuit 10 also adjusts the frequency characteristics of the preset frequency point through the first compensation unit 30 and the second compensation unit 40 in its branch, and the reverse attenuation circuit 20 also adjusts the frequency characteristics of the preset frequency point through the third compensation unit 50 and the fourth compensation unit 60 in its branches. In the present application, the first compensation unit 30, the second compensation unit 40, the third compensation unit 50 and the fourth compensation unit 60 are all adjustable capacitor units composed of fixed-value capacitors, and the capacity of the adjustable capacitor units can be adjusted within a preset capacity range, so as to simulate the adjustable capacity in the prior art, and adjust the frequency characteristics of the forward attenuation circuit 10 and the reverse attenuation circuit 160 at the preset frequency point. In addition, because the first compensation unit 30, the second compensation unit 40, the third compensation unit 50 and the fourth compensation unit 60 adopt constant capacitance, which refers to the capacitance that has been set in advance, on the basis of realizing frequency characteristic adjustment, this embodiment also avoids the adjustable capacity from being easily influenced by external temperature, speed or mechanical vibration, improves the stability of the forward attenuation circuit 10 and reverse attenuation circuit 160, and reduces the measurement error of the differential voltage probe, thus effectively solving the problems of poor stability of the attenuator and distortion of the measurement results of the differential voltage probe when adjustable capacitors are used to adjust the amplitude-frequency characteristics in the prior art.

Figure 2:
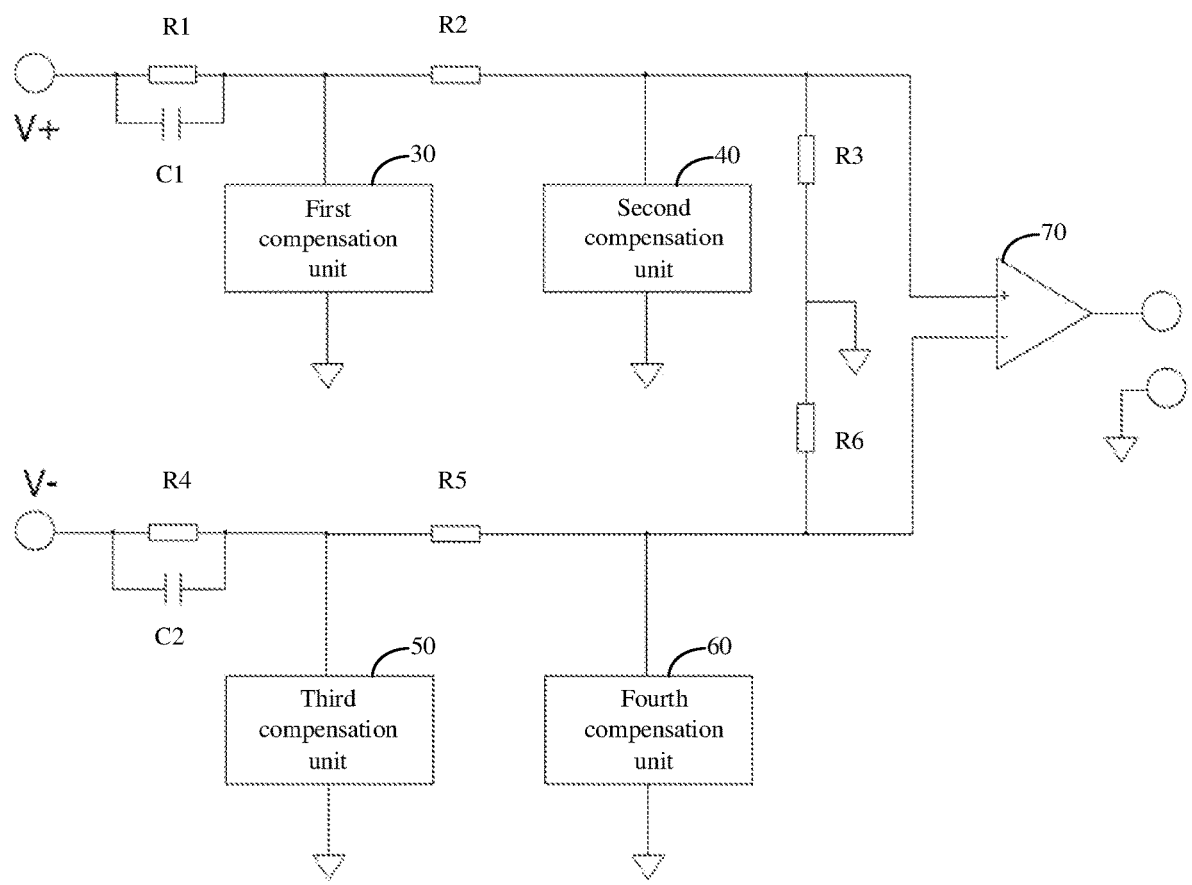
FIG. 2 is a schematic diagram of the circuit structure of an attenuator provided by another embodiment of this application.

Optionally, as a preferred embodiment of this application, as shown in FIG. 2, the forward attenuation circuit 10 includes:

a first resistor R1, a second resistor R2, a third resistor R3 and a first capacitor C1;

a first parallel end of the first capacitor C1 and the first resistor R1 is connected with a positive polarity of a signal to be tested, and a second parallel end of the first capacitor C1 and the first resistor R1 is connected with a first end of the first compensation unit 30 and a first end of the second resistor R2;

a common between a second end of the second resistor R2 and a first end of the third resistor R3 is connected with a first end of the second compensation unit 40 and a non-inverting input of the differential amplifier 70;

a second end of the third resistor R3 is connected with a floating output.

The reverse attenuation circuit 20 includes:

a fourth resistor R4, a fifth resistor R5, a sixth resistor R6 and a second capacitor C2;

a first parallel end of the second capacitor C2 and the fourth resistor R4 is connected with a negative polarity of a signal to be tested, and a second parallel end of the second capacitor C2 and the fourth resistor R4 is connected with a first end of the third compensation unit 50 and a first end of the fifth resistor R5;

a common between a second end of the fifth resistor R5 and a first end of the sixth resistor R6 is connected with a first end of the fourth compensation unit 60 and an inverting input of the differential amplifier 70;

a second end of the sixth resistor R6 is connected with a floating output.

In the forward attenuation circuit 10, the first resistor R1, the second resistor R2, and the third resistor R3 constitute a voltage dividing network of the positive-going signal to be tested, which is used to attenuate the positive-going signal to be tested.

The first capacitor C1 constitutes a high-frequency compensation capacitor, which is used to perform high-frequency compensation on the positive-going signal to be tested, so as to improve the quality of high-frequency components in the positive-going signal to be tested. The first compensation unit 30 of the forward attenuation circuit 10 constitutes a compensation capacitor of a first preset frequency point, which is used to adjust the frequency characteristics of the positive-going signal to be tested at the first preset frequency point. The second compensation unit 40 of the forward attenuation circuit 10 constitutes a compensation capacitor of a second preset frequency point, which is used to adjust the frequency characteristics of the negative-going signal to be tested at the second preset frequency point.

As the reverse attenuation circuit 20 and the forward attenuation circuit 10 are symmetrical to each other, similar to the forward attenuation circuit 10, in the reverse attenuation circuit 20, the fourth resistor R4, the fifth resistor R5 and the sixth resistor R6 constitute a voltage dividing network of the negative-going signal to be tested, which is used to attenuate the negative signals to be tested. The second capacitor C2 constitutes a high-frequency compensation capacitor, which is used to perform high-frequency compensation on the negative-going signal to be tested, so as to improve the quality of high-frequency components in the negative-going signal to be tested. The third compensation unit 50 of the reverse attenuation circuit 20 constitutes a compensation capacitor of a first preset frequency point, which is used to adjust the frequency characteristics of the negative-going signal to be tested at the first preset frequency point. The fourth compensation unit 60 of the reverse attenuation circuit 20 constitutes a compensation capacitor of a second preset frequency point, which is used to adjust the frequency characteristics of the negative-going signal to be tested at the second preset frequency point.

Optionally, as a preferred embodiment of this application, the first preset frequency point may be 1 MHz and the second preset frequency point may be 100 KHz.

As described above, the first compensation unit 30 of the forward attenuation circuit 10 and the third compensation unit 50 of the reverse attenuation circuit 20 are symmetrical with each other and have the same structure, and both include: a first compensation resistor; at least K fixed-value capacitor units connected in parallel, a first parallel end of the fixed-value capacitor units is connected with the first compensation resistor, and a second parallel end is connected with a floating output, and each fixed-value capacitor unit comprises a switch and a fixed-value capacitor connected in series with each other; a capacity of each fixed-value capacitor corresponds to a bit value of a binary bit; and K is a positive integer.

In the present application, this embodiment combines the constant capacitance and the switch to construct the capacitance ranges of the first compensation unit 30 and the third compensation unit 50. Wherein, each fixed-value capacitor unit represents a binary bit, the on-off of the switch represents 0 and 1 of the binary bit, and the capacity of the fixed-value capacitor represents the bit value of the binary bit, and its capacity is determined by the binary bit it represents. Therefore, the capacities of the constant capacitance in the fixed-value capacitor units are different from each other. The capacity of the constant capacitance in each constant capacitance unit is: $P*2^{(k-1)}$; in which P represents the lowest capacity, k represents the binary bit corresponding to the fixed-value capacitor unit, k=1, 2, ..., K.

As a preferred embodiment of this application, the fixed-value capacitor is preferably a ceramic capacitor with high stability, such as a ceramic capacitor made of COG material, so as to improve the stability of the first compensation unit and the third compensation unit. Optionally, according to the control mode, the switch may be a mechanical switch in the binary encoder. In this case, the first compensation unit 30 of the forward attenuation circuit 10 and the third compensation unit 50 of the reverse attenuation circuit 20 also include at least one binary encoder. With the mechanical switch in the binary encoder, whether the fixed-value capacitor unit is gated or not is controlled to realize the adjustment within the preset capacitance range. As a preferred embodiment of this application, the binary encoder may be a rotary encoder, such as 8421 rotary encoder. The user can change the capacity of the first compensation unit or the third compensation unit by rotating the switch, so as to realize the same adjustment mode and experience as the adjustable capacity in the prior art.

Optionally, the switch may also be an electric control switch, and the attenuator further includes a controller, and the control end of the electric control switch is connected with the controller. The controller is configured to output a binary signal to control the on-off of the electric control switch. In the present application, the electric control switch includes but is not limited to relays, transistors and analog switches. The controller may be a single chip microcomputer inside the differential voltage probe. In an embodiment, the single chip microcomputer is connected to a computer device through a communication interface, and preset software is installed on the computer device. The user can operate the preset software to generate a binary signal, so that the single chip microcomputer receives the binary signal, and the electric control switch is turned on or off according to the binary signal, thereby adjusting the capacity of the first compensation unit or the third compensation unit, and realizing the adjustment of the frequency characteristics at the first preset frequency point for the forward attenuation circuit or the reverse attenuation circuit. In another embodiment, the single-chip microcomputer comes with a keyboard, and the user generates a binary signal by operating the keyboard, so that the single chip microcomputer can turn on or off the electric control switch according to the binary signal, thereby adjusting the capacity of the first compensation unit or the third compensation unit, and realizing the adjustment of the frequency characteristics at the first preset frequency point for the forward attenuation circuit or the reverse attenuation circuit.

The second compensation unit 40 of the forward attenuation circuit 10 and the fourth compensation unit 60 of the reverse attenuation circuit 20 are symmetrical with each other and have the same structure, and both include: a second compensation resistor; at least fixed-value capacitor units connected in parallel, a first parallel end of the fixed-value capacitor units is connected with the second compensation resistor, and a second parallel end is connected with a floating output, and each fixed-value capacitor unit comprises a switch and a fixed-value capacitor connected in series with each other; a capacity of each fixed-value capacitor corresponds to a bit value of a binary bit; and is a positive integer. In the present application, the structure and function of the switch and the capacity definition of the constant capacitance are the same as those of the first compensation unit 30 and the third compensation unit 50. For details, please refer to the description of the above embodiments, which will not be repeated here. It should be noted that the first compensation resistors in the first compensation unit 30 and the third compensation unit 50 are different from the second compensation resistors in the second compensation unit 40 and the fourth compensation unit 60.

Figure 3:
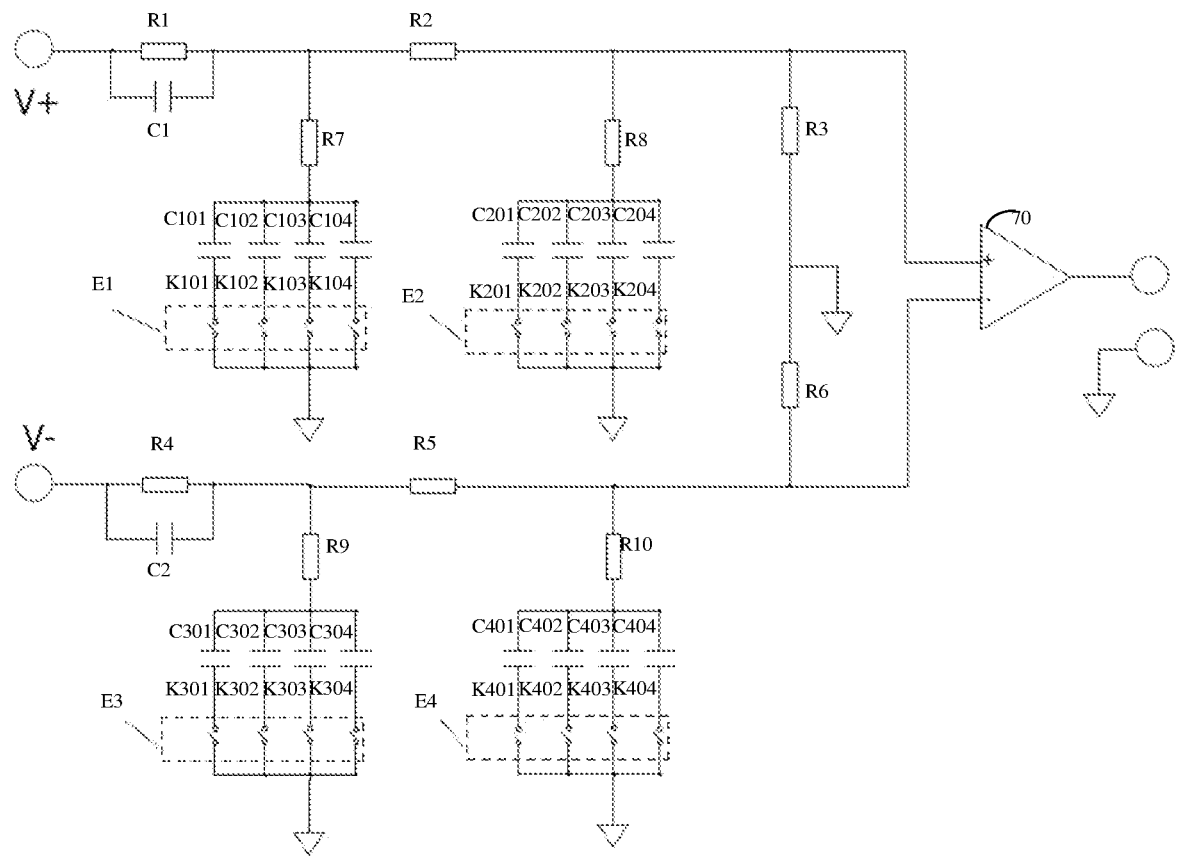
FIG. 3 is a schematic diagram of the circuit structure of an attenuator provided by another embodiment of this application.

To facilitate the understanding, a specific embodiment of the present application is given below. As shown in FIG. 3, in this embodiment, the first compensation unit 30 of the forward attenuation circuit 10 includes a first compensation resistor R7, four fixed-value capacitors C101, C102, C103 and C104 connected in parallel, and a 4-bit binary encoder E1, such as an 8421 rotary encoder. Among them, the fixed-value capacitors C101, C102, C103 and C104 respectively constitute a fixed-value capacitor unit with mechanical switches K101, K102, K103 and K104 in the binary encoder E1.

The second compensation unit 40 of the forward attenuation circuit 10 includes a second compensation resistor R8, four fixed-value capacitors C201, C202, C203 and C204 connected in parallel, and a 4-bit binary encoder E2, such as an 8421 rotary encoder. Among them, the fixed-value capacitors C201, C202, C203 and C204 respectively constitute a fixed-value capacitor unit with mechanical switches K201, K202, K203 and K204 in the binary encoder E2.

The third compensation unit 50 of the reverse attenuation circuit 20 includes a first compensation resistor R9, four fixed-value capacitors C301, C302, C303 and C304 connected in parallel, and a 4-bit binary encoder E3, such as an 8421 rotary encoder. Among them, the fixed-value capacitors C301, C302, C303 and C304 respectively constitute a fixed-value capacitor unit with mechanical switches K301, K302, K303 and K304 in the binary encoder E3.

The fourth compensation unit 60 of the reverse attenuation circuit 20 includes a second compensation resistor R10, four fixed-value capacitors C401, C402, C403 and C404 connected in parallel, and a 4-bit binary encoder E4, such as an 8421 rotary encoder. Among them, the fixed-value capacitors C401, C402, C403 and C404 respectively constitute a fixed-value capacitor unit with mechanical switches K401, K402, K403 and K404 in the binary encoder E4.

The first compensation unit 30 of the forward attenuation circuit 10 and the third compensation unit 50 of the reverse attenuation circuit 20 are symmetrical with each other, have the same structure, and have the same attributes of each component. The second compensation unit 40 of the forward attenuation circuit 10 and the fourth compensation unit 60 of the reverse attenuation circuit 20 are symmetrical with each other, have the same structure, and have the same attributes of each component.

Take the first compensation unit 30 of the forward attenuation circuit 10 as an example. When the capacities of four fixed-value capacitors C101, C102, C103 and C104 connected in parallel are 1 PF, 2 PF, 4 PF and 8 PF respectively, combined with the 8421 rotary encoder, the preset capacitance range of the first compensation unit 30 is 0 to 15 PF, and the resolution is 1 PF. When the capacities of four fixed-value capacitors C101, C102, C103 and C104 connected in parallel are 2 PF, 4 PF, 8 PF and 16 PF respectively, combined with the 8421 rotary encoder, the preset capacitance range of the first compensation unit 30 is 0 to 30 PF, and the resolution is 2 PF. The principle of the preset capacitance ranges in the second compensation unit 40, the third compensation unit 50 and the fourth compensation unit 60 is the same, which will not be repeated here.

On this basis, if it is necessary to expand the preset capacitance ranges of the first compensation unit 30, the second compensation unit 40, the third compensation unit 50 and the fourth compensation unit 60, one or more fixed-value capacitor units may be connected in parallel respectively. The capacity of the constant capacitance in the fixed-value capacitor unit is determined by the binary bit value represented by the fixed-value capacitor unit, and the switch may be a single pole single throw switch, or a mechanical switch in the lowest bit of another 8421 rotary encoder.

Figure 4:
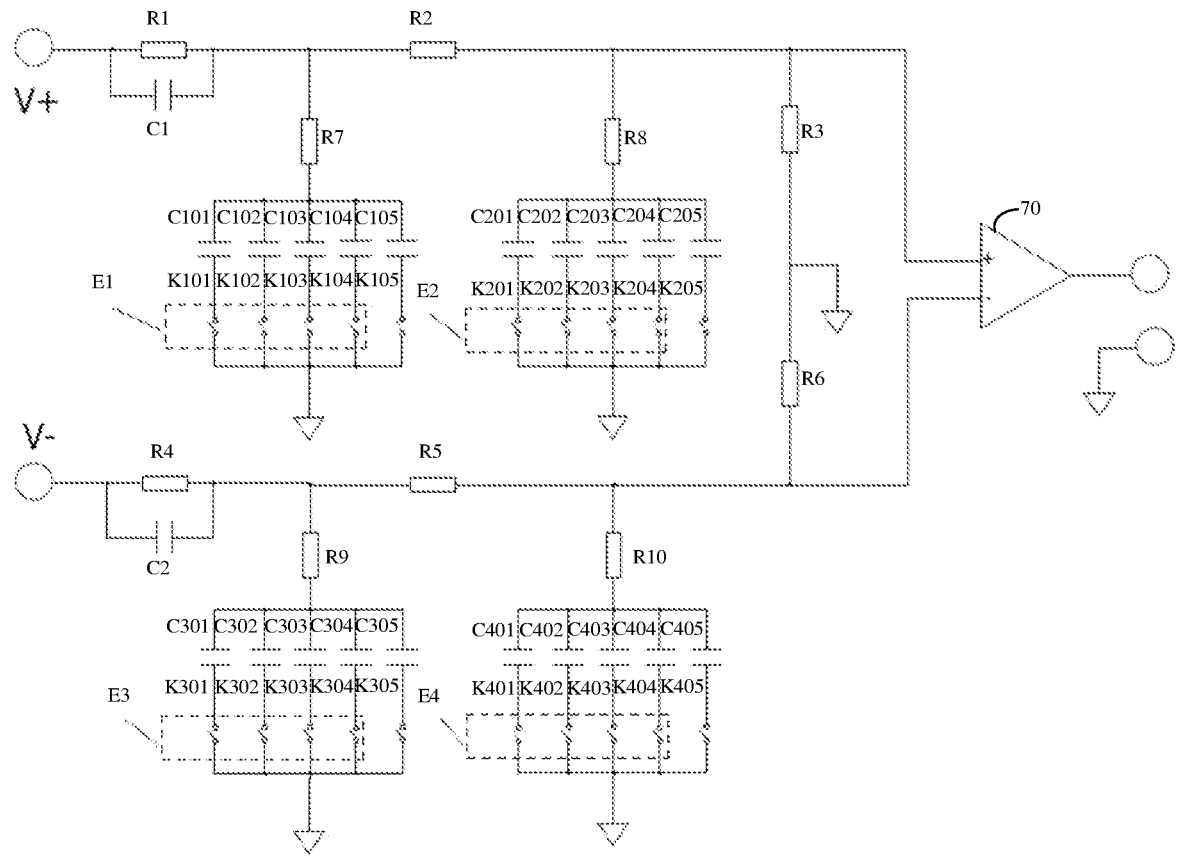
FIG. 4 is a schematic diagram of the circuit structure of an attenuator provided by another embodiment of this application.

Exemplarily, in FIG. 3, the capacities of four fixed-value capacitors C101, C102, C103 and C104 of the first compensation unit 30 connected in parallel are 1 PF, 2 PF, 4 PF and 8 PF, respectively, and the preset capacitance range is 0-15 PF. If it is necessary to expand the preset capacitance range to 0-30 PF, a fixed-value capacitor unit composed of a fixed-value capacitor C105 and a switch K105 may be connected in parallel, as shown in the FIG. 4. Among them, the fixed-value capacitor C105 represents the fifth binary bit in the binary system, and its capacity is PF. The switch K105 may be a single pole single throw switch or a mechanical switch in the lowest bit of another 8421 rotary encoder. The third compensation unit 50 also needs to be connected in parallel with a fixed-value capacitor C305 and a switch K305, so as to be symmetrical with the first compensation unit 30. If it is necessary to adjust the preset capacitance ranges in the second compensation unit 40 and the fourth compensation unit 60, the principle is the same as above, so it will not be repeated here.

All up, the application provides an attenuator, comprising a forward attenuation circuit and a reverse attenuation circuit which are symmetrical with each other, a first compensation unit and a third compensation unit which are symmetrical with each other, a second compensation unit and a fourth compensation unit which are symmetrical with each other, and a differential amplifier; the first compensation unit, second compensation unit, third compensation unit and fourth compensation unit are all adjustable capacitor units composed of constant capacitance; a positive-going signal to be tested is attenuated by the forward attenuation circuit, and frequency characteristics of a preset frequency point are adjusted by the first compensation unit and second compensation unit; a negative-going signal to be tested is attenuated by the reverse attenuation circuit, and frequency characteristics of a preset frequency point are adjusted by the third compensation unit and fourth compensation unit; finally, the differential amplifier is used to calculate the difference value, amplify it and output it. According to the embodiments of the present application, the existing adjustable capacitors are replaced by the compensation unit composed of fixed-value capacitors, which not only realizes the adjustment range of the adjustable capacitance, but also overcomes the disadvantage that the adjustable capacitance is easily influenced by the environment, effectively solving the problems of poor stability of the attenuator and distortion of the measurement results of the differential voltage probe when the adjustable capacitors are used to adjust the amplitude-frequency characteristics in the prior art.

The above embodiments are only used to illustrate the technical solutions of the present application, rather than limiting it. Although the present application has been described in detail with reference to the foregoing embodiments, those skilled in the art will appreciate that it is still possible to modify the technical solutions described in the foregoing embodiments, or equivalently replace some of its technical features. However, these modifications or substitutions do not make the essence of the corresponding technical solutions deviate from the spirit and scope of the technical solutions of each embodiment of the present application, and shall be included in the scope of protection of the present application.

What is claimed is:

1. An attenuator, comprising a forward attenuation circuit and a reverse attenuation circuit which are symmetrical with each other, a first compensation unit and a third compensation unit which are symmetrical with each other, a second compensation unit and a fourth compensation unit which are symmetrical with each other, and a differential amplifier;

a first end of the forward attenuation circuit is connected with a positive polarity of a signal to be tested, and a second end is connected with a non-inverting input of the differential amplifier, a third end is connected with a first end of the first compensation unit, and a fourth end is connected with a first end of the second compensation unit;

a first end of the reverse attenuation circuit is connected with a negative polarity of a signal to be tested, and a second end is connected with an inverting input of the differential amplifier, a third end is connected with a first end of the third compensation unit, and a fourth end is connected with a first end of the fourth compensation unit;

a fifth end of the forward attenuation circuit and a fifth end of the reverse attenuation circuit are commonly connected to a floating output;

second ends of the first compensation unit, the second compensation unit, the third compensation unit and the fourth compensation unit are respectively connected to a floating output;

the forward attenuation circuit is used to attenuate a positive-going signal to be tested, and adjust the frequency characteristics of a preset frequency point through the first compensation unit and the second compensation unit;

the reverse attenuation circuit is used to attenuate a negative-going signal to be tested, and adjust the frequency characteristics of a preset frequency point through the third compensation unit and the fourth compensation unit;

the differential amplifier is used for receiving the positive-going signal to be tested attenuated by the forward attenuation circuit and the negative-going signal to be tested attenuated by the reverse attenuation circuit, and amplifying and outputting a difference between the attenuated positive-going signal to be tested and negative-going signal to be tested according to a preset gain.

2. The attenuator of claim 1, wherein the forward attenuation circuit comprises a first resistor, a second resistor, a third resistor and a first capacitor;

a first parallel end of the first capacitor and the first resistor is connected with a positive polarity of a signal to be tested, and a second parallel end of the first capacitor and the first resistor is connected with a first end of the first compensation unit and a first end of the second resistor;

a common between a second end of the second resistor and a first end of the third resistor is connected with a first end of the second compensation unit and a non-inverting input of the differential amplifier;

a second end of the third resistor is connected with a floating output.

3. The attenuator of claim 1, wherein the reverse attenuation circuit comprises a fourth resistor, a fifth resistor, a sixth resistor and a second capacitor;

a first parallel end of the second capacitor and the fourth resistor is connected with a negative polarity of a signal to be tested, and a second parallel end of the second capacitor and the fourth resistor is connected with a first end of the third compensation unit and a first end of the fifth resistor;

a common between a second end of the fifth resistor and a first end of the sixth resistor is connected with a first end of the fourth compensation unit and an inverting input of the differential amplifier;

a second end of the sixth resistor is connected with a floating output.

4. The attenuator of claim 1, wherein the first compensation unit/third compensation unit comprises:
  a first compensation resistor;
  at least K fixed-value capacitor units connected in parallel, a first parallel end of the fixed-value capacitor units is connected with the first compensation resistor, and a second parallel end is connected with a floating output, and each fixed-value capacitor unit comprises a switch and a fixed-value capacitor connected in series with each other;
  a capacity of each fixed-value capacitor corresponds to a bit value of a binary bit;
  and K is a positive integer.

5. The attenuator of claim 1, wherein the second compensation unit/fourth compensation unit comprises:
  a second compensation resistor;
  at least K fixed-value capacitor units connected in parallel, a first parallel end of the fixed-value capacitor units is connected with the second compensation resistor, and a second parallel end is connected with a floating output, and each fixed-value capacitor unit comprises a switch and a fixed-value capacitor connected in series with each other;
  a capacity of each fixed-value capacitor corresponds to a bit value of a binary bit;
  and K is a positive integer.

6. The attenuator of claim 4, wherein a fixed-value capacity of each fixed-value capacitor unit is: $P*2^{(k-1)}$
  in which P represents the lowest capacity, k represents the binary bit corresponding to the fixed-value capacitor unit, k=1, 2, . . . , K.

7. The attenuator of claim 6, wherein the switch is a mechanical switch in a binary encoder;
  the attenuator also comprises at least one binary encoder.

8. The attenuator of claim 7, wherein the binary encoder is an 8421 rotary encoder.

9. The attenuator of claim 6, wherein the switch is an electric control switch;
  the attenuator also comprises a controller;
  a control end of the electric control switch is connected with the controller;
  the controller is configured to output a binary signal to control the on-off of the electric control switch.

10. The attenuator of claim 6, wherein the fixed-value capacitor is a ceramic capacitance.

11. A differential voltage probe, comprising the attenuator of claim 1.

12. The attenuator of claim 2, wherein the first compensation unit/third compensation unit comprises:
  a first compensation resistor;
  at least K fixed-value capacitor units connected in parallel, a first parallel end of the fixed-value capacitor units is connected with the first compensation resistor, and a second parallel end is connected with a floating output, and each fixed-value capacitor unit comprises a switch and a fixed-value capacitor connected in series with each other;
  a capacity of each fixed-value capacitor corresponds to a bit value of a binary bit;
  and K is a positive integer.

13. The attenuator of claim 3, wherein the first compensation unit/third compensation unit comprises:
a first compensation resistor;
at least K fixed-value capacitor units connected in parallel, a first parallel end of the fixed-value capacitor units is connected with the first compensation resistor, and a second parallel end is connected with a floating output, and each fixed-value capacitor unit comprises a switch and a fixed-value capacitor connected in series with each other;
a capacity of each fixed-value capacitor corresponds to a bit value of a binary bit;
and K is a positive integer.

14. The attenuator of claim 2, wherein the second compensation unit/fourth compensation unit comprises:
a second compensation resistor;
at least K fixed-value capacitor units connected in parallel, a first parallel end of the fixed-value capacitor units is connected with the second compensation resistor, and a second parallel end is connected with a floating output, and each fixed-value capacitor unit comprises a switch and a fixed-value capacitor connected in series with each other;
a capacity of each fixed-value capacitor corresponds to a bit value of a binary bit;
and K is a positive integer.

15. The attenuator of claim 3, wherein the second compensation unit/fourth compensation unit comprises:
a second compensation resistor;
at least K fixed-value capacitor units connected in parallel, a first parallel end of the fixed-value capacitor units is connected with the second compensation resistor, and a second parallel end is connected with a floating output, and each fixed-value capacitor unit comprises a switch and a fixed-value capacitor connected in series with each other;
a capacity of each fixed-value capacitor corresponds to a bit value of a binary bit;
and K is a positive integer.

16. The attenuator of claim 5, wherein a fixed-value capacity of each fixed-value capacitor unit is: $P*2^{(k-1)}$
in which P represents the lowest capacity, k represents the binary bit corresponding to the fixed-value capacitor unit, k=1, 2, . . . , K.

17. A differential voltage probe, comprising the attenuator of claim 2.

18. A differential voltage probe, comprising the attenuator of claim 3.

19. A differential voltage probe, comprising the attenuator of claim 4.

20. A differential voltage probe, comprising the attenuator of claim 5.

* * * * *